March 13, 1962 G. F. GORDON ET AL 3,025,339

ELECTRICAL CONNECTION MEANS

Filed July 1, 1960

George F. Gordon
Hector R. Durocher
INVENTORS

Robert O. Richardson
ATTORNEY

United States Patent Office 3,025,339
Patented Mar. 13, 1962

3,025,339
ELECTRICAL CONNECTION MEANS

George F. Gordon and Hector R. Durocher, Nashua, N.H., assignors to Sanders Associates, Inc., Nashua, N.H., a corporation of Delaware
Filed July 1, 1960, Ser. No. 40,218
7 Claims. (Cl. 174—84)

This invention relates to electrical connection means, and in particular, to electrical connection means for insulated, flat, planar, electrical conductors.

In connecting electrical conductors to electrical devices having pin type terminations, it is common to use solder joints for providing both mechanical and electrical connections. The maximum mechanical strength of the solder joint is obtained when the solder is placed in shear. Therefore, it is always desirable to have the solder so placed that any tendency to separate the conductor from the terminals causes the solder to resist the load by shear stresses. In order to accomplish this it is common when connecting wire to a pin to interpose a right angle connector between the wire and pin. The right angle connector provides a surface perpendicular to the axial length of the pin for providing the base of a solder fillet. One type of right angle connector that is generally used has two mutually perpendicular legs. One leg is soldered to the conductor while the other leg has an aperture for engagement with a terminal pin. The conductor and right angle connector are presoldered and the conductor-connector assembly is then inserted over the pins through the aperture provided. Finally, the connector is soldered to the pin. One of the serious disadvantages of this type of connection is that the reliability of the joint is dependent not only on the strength of the terminal to connector joint, but on the connector to wire joint. Making two joints is more expensive and time consuming as well as less reliable than making one.

The electrical connection means of the present invention generally consists of insulated, flat, planar electrical conductor and an elongated electrical contact. The conductor is insulated except for one planar surface which is exposed for providing a terminal at one end thereof. The terminal is also provided with an aperture for engagement with the elongated electrical contact device. In addition, the exposed terminal portion is bent in the vicinity of the aperture so that when the conductor is inserted over the elongated electrical contact, through the aperture, a portion of the contact is in abutting relationship with a portion of the exposed conductor. The bend in the conductor provides a base and a leg for a solder fillet when the joint is soldered. Thus, the intermediate connection required between the prior art right angle connectors and the conductor is eliminated by the present invention. Since the conductor and connector of the present invention are unitary, it can be readily seen that it is more economical and reliable than connections of the prior art.

It is therefore an object of the invention to provide for a more reliable electrical connection means.

It is a further object to provide for an electrical connection means with simplified construction for economical manufacture.

In accordance with the present invention, there is provided an electrical connection means adapted for connection to an elongated conducting element comprising a layer of electrically insulating material. An electrical conductor is bonded to the insulating material for providing an assembly thereof. The assembly has an aperture therein and is bent substantially near the aperture for placing the elongated conducting element in abutting contact substantially along its entire length, when it is inserted in the aperture in the assembly.

As used herein, the term "plastic" includes a synthetic organic material of high molecular weight, and which while solid in the finished state, at some state in its manufacture, is soft enough to be formed into shape by some degree of flow.

The well-known term "Kel–F" as used herein is the trademark of the M. W. Kellogg Company and refers to the plastic polymonochlorotrifluorochloroethylene as manufactured by them.

The well-known term "Teflon" as used herein is the trademark of the E. I. du Pont de Nemours & Co., Inc., and refers to the plastic polymer tetra-fluoroethylene as manufactured by them.

The term "ethylene" includes all those plastic materials containing an ethylene radical, and the term "vinyl" includes all those plastic materials containing a vinyl radical.

The term "Saran" trademark of the Dow Chemical Company, is used herein to denote those plastic materials containing a vinylidine radical.

The term "nylon" as used herein refers generically to the group of plastic materials known as polyamides.

For a better understanding of the present invention, together with other and further objects thereof, reference is made to the following description with the accompanying drawings, and its scope will be pointed out in the appended claims.

Figure 1:
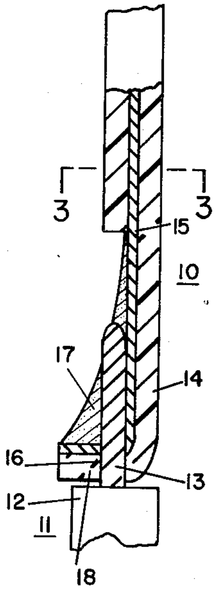
FIG. 1 is a side elevation view, partly in section, of the preferred embodiment of the electrical connection means of the present invention.
Figure 2:
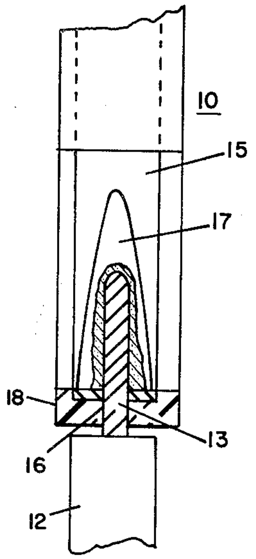
FIG. 2 is a front elevation view, partly in section, of the embodiments shown in FIG. 1.

Referring now to the drawings, and with particular reference to FIGS. 1 and 2, there is shown, respectively, side and front elevational views, of the preferred embodiment of the present invention. There is broadly shown an electrical connection means including a flat insulated conductor 10 and a male electrical contact 11. The male electrical contact 11 is preferably of a commercially available pin type male connector which includes an insulating base 12 and an elongated terminal pin 13. The insulated conductor 10 is preferably a laminate or extrusion of insulating material 14, such as Kel–F, and a copper conductor 15. A conductor of the type shown is manufactured by Sanders Associates, Inc., Nashua, New Hampshire, and is commercially available under their registered trademark "Flexprint."

Figure 3:
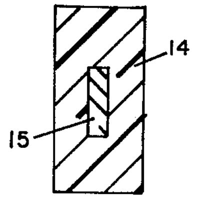
FIG. 3 is a sectional view taken along line 3—3 in FIG. 1.

In FIG. 3, there is shown a typical cross-section of the insulated conductor in FIG. 1, taken along line 3—3. As can be seen in FIG. 3, both the conductor 15 and insulation 14 are of rectangular cross-section. The rectangular cross-section is advantageous in many applications in that it provides flexibility of the insulated conductor about its minor axis.

To form the electrical connection means as shown in FIGS. 1 and 2, one layer of the insulating material 14 is removed to expose a planar surface of copper. The insulation is removed from the end of the conductor 10 to a point sufficient for providing electrical contact of the conductor along the entire length of the elongated terminal pin 13, after assembly. The insulation may be removed by passing an abrasive instrumentality, such as a grinding wheel, across the layer of insulation. The result of this operation is to leave exposed a clean surface of copper. An aperture 16 is made through the conductor 15 and remaining layer of insulating material 14. The exposed copper and insulating material is then bent in the vicinity of the conductor at an angle of approximately 90 degrees for providing a flange 18. Where the thickness of the copper and plastic laminate is below .020 inch, the bending operation for most insulating materials can be performed by hand. However, where the resiliency or combined thickness of plastic and copper is too great, the bending operation may be performed in a bending die by applying suitable heat and pressure. After the bend is placed in the copper, the insulated cable is at this point a female connector.

To complete the electrical connection means, the bent cable 10 is then inserted over the terminal pin 13 through the aperture 16. This assembly may then be soldered by conventional soldering techniques (i.e. dip soldering or hand soldering techniques). It is preferable that a fillet of solder as shown at 17 be used to join the pin 13 and conductor 15. With a solder fillet of this type, any axial pulling along the length of the conductor will place the solder in shear, where it has its maximum strength, rather than in tension. The bend in the insulated cable provides a convenient mechanism for obtaining the solder fillet shown. The portion of copper conductor along the flange 18 provides a base for the solder fillet, while the portion of the copper conductor transverses to the flange provides a leg for the solder fillet. Because the solder is placed in shear when the insulated cable is pulled along its length, and the copper conductor 15 contacts the elongated terminal pin 17 substantially along its entire length, a good mechanical and electrical connection is made between the insulated conductor 10 and contact 11.

Figure 4:
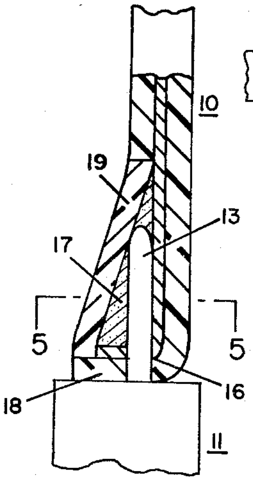
FIG. 4 is a side elevation view, partly in section, of another embodiment of the present invention.
Figure 5:
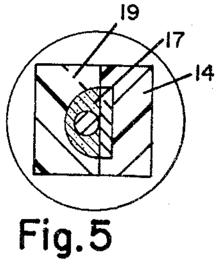
FIG. 5 is a sectional view taken along 5—5 in FIG. 4.

It is often desirable to electrically insulate the connection shown in FIGS. 1 and 2. The purpose of providing insulation is to prevent dirt and moisture from effecting the electrical properties of the connection. In FIG. 4, there is shown the electrical connection means of FIGS. 1 and 2 insulated by encapsulation in an insulating material 19. This may be more clearly seen in FIG. 5, which is a plan view, in section, taken along the line 5—5 in FIG. 4. As can be seen in FIG. 5, the insulating material 19 surrounds the solder fillet 17 and is bonded to the insulating material 14, thus providing a complete encapsulation of the electrical connection. It has been found that epoxy resin of the type manufactured by the Shell Chemical Corporation of New York, New York, and designated by their registered trademark "Epon" may be used as the insulating material. In particular, it has been found that Epon 828 when combined with a curing agent of the amine type works well in this application. The curing agent causes the Epon 828 to polymerize and harden thus providing good electrical insulation. To apply the insulating material well known "potting" techniques may be used. To "pot" the electrical connection shown in FIGS. 1 through 5, a mixture of 100 parts by weight of Epon 828 and eight parts by weight of diethylene triamine may be used. After this mixture has polymerized and hardened, the potting mold may be removed and the connection will be encapsulated by the hardened epoxy as shown in FIGS. 4 and 5. By selecting the proper insulating material and properly proportioning it with curing agent 19 may be made rigid, resilient or flexible.

Figure 6:
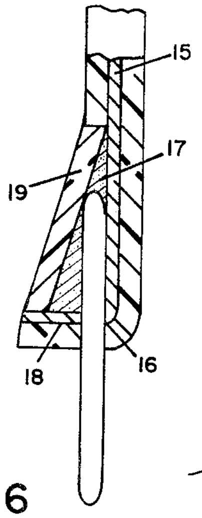
FIG. 6 is a side elevation view, partly in section of a male connector made in accordance with the present invention.

Referring now to FIG. 6, there is shown another embodiment of the present invention in which the insulated cable may be made into a male connector in contrast with the female connectors shown in FIGS. 1 through 5. To provide for the male connector of FIG. 6, the insulation 14 is removed, the aperture 16 is provided, and the bend is made to form the flange 18 as previously described in reference to FIGS. 1 to 5. An elongated pin 20 is inserted through the aperture 16 and soldered to the conductor 15 as heretofore discussed with the reference to FIGS. 1 to 5. It should be noted that a solder fillet 17 is also provided in this embodiment. A portion of the elongated pin 16 extends beyond the flange 18 for insertion into a female receptacle in use. The solder fillet and electrical connection of the pin 16 to the conductor 15 may be insulated in accordance with the method described in connection with FIGS. 4 and 5.

Figure 7:
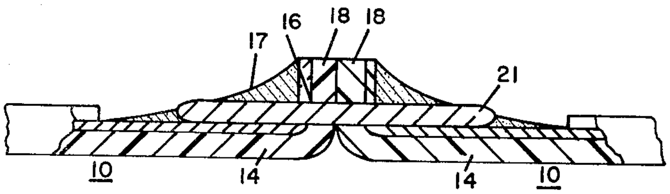
FIG. 7 is a side elevation view, partly in section, showing another embodiment of the present invention.

Referring now to FIG. 7, there is shown another embodiment of the present invention, in particular, there is shown an electrical connection between two flat insulated cables of the type shown in section in FIG. 3. The terminal ends of two cables 10 are prepared in the manner similar to preparing the female connector shown in FIGS. 1 through 5. That is, the insulation 14 is removed to expose one planar surface of the copper conductor on each cable. Apertures 16 are placed through the remaining copper and insulation on each cable as shown. The cables are then bent adjacent the apertures to form flanges 18. An elongated pin 21 is inserted through the aperture 16 in one of the cables and soldered thereto along the length of the exposed copper. Preferably a solder fillet is left between the exposed copper on the flange and the remaining exposed copper as shown. A sufficient length of pin 21 is left exposed for connection to the other insulated cable 10. The flange 18 of the insulated cable not having the pin soldered thereto is then placed in abutting relationship with the flange of the previous assembly. The exposed portion of the pin is then soldered to the other insulated cable 10 in the manner heretofore described, thus providing the electrical connection means shown in FIG. 7.

Although not shown in FIG. 7, the solder may be insulated by encapsulating as described in reference to FIGS. 4–6, inclusive. The electrical connection means shown in FIG. 7 is particularly advantageous in that any axial pulling along the axis of the conductor 15 is resisted in shear by both solder fillets. Furthermore, the loads are further resisted by the fact that the flanges 18 tend to rotate against each other and cannot separate because bearing forces between the aperture and the pin will resist any tendency to separate. Therefore, the joint shown in FIG. 7 is fail-safe, that is, if the solder should fail, the cables will still tend to remain locked because of the mechanical locking of the pin 21 in the apertures 16.

It also should be noted that by leaving a layer of insulating material behind the exposed copper, as shown in FIGS. 1–7, inclusive, there is a tendency to reduce breakage at the terminals because of the reinforcing effect of the insulating material.

While there has been described what are at present considered to be the preferred embodiments of the invention, it will be obvious to those skilled in the art that various changes and modifications may be made therein without departing from the invention; and it is therefore, aimed in the appended claims to cover all such changes as fall fairly within the true spirit and scope of this invention.

What is claimed is:

1. An electrical connector means, comprising: a male electrical connector including an elongated conducting element; a layer of electrically insulating material; and an electrical conductor bonded to said insulating material for providing an assembly thereof, said assembly having an aperture therein and being bent substantially adjacent thereto, said elongated element being inserted through said aperture and positioned in abutting electrical contact substantially along the length thereof with said conductor.

2. An electrical connection means, comprising: a thin, flat insulated electrical conductor having a planar exposed conductor surface near the end thereof. said exposed surface and insulation having an aperture therein and being bent adjacent said aperture for providing a flange; an elongated male connector inserted through said aperture and in abutting electrical contact substantially along its entire length with said exposed conductor surface.

3. The electrical connection means of claim 2 wherein said elongated male connector is joined to said conductor by a fillet of solder having a base joined to said exposed conductor on said flange and a leg joined to said connector and a remaining portion of said exposed conductor surface.

4. The electrical connection means of claim 3 wherein said solder is encapsulated in an insulating material.

5. An electrical connection means, comprising: a first thin, flat insulated electrical conductor having a planar exposed conductor surface near the end thereof, said exposed surface and insulation having an aperature therein and being bent adjacent said aperture for providing a flange; a second thin, flat insulated conductor having a planar exposed conductor surface and insulation having an aperture therein and being bent adjacent thereto for providing a flange, said first and second conductor flanges being in abutting relationship to each other whereby said apertures are substantially coaxial; and an elongated conducting element and inserted through said apertures in abutting electrical contact, substantially along the length thereof, with said conductors.

6. The electrical connection means of claim 5 wherein the elongated element is joined to the first and second conductors by fillets of solder, said fillets having bases joined to said exposed conductors on said flanges, and legs joined to said elongated element and remaining portions of said exposed conductor surfaces.

7. The electrical connection means of claim 6 wherein said solder is encapsulated in an insulating material.

No references cited.